United States Patent
Hudson et al.

(10) Patent No.: US 10,628,064 B2
(45) Date of Patent: Apr. 21, 2020

(54) PARAMETER OVERRIDE MECHANISM FOR MEMORY SYSTEMS

(71) Applicant: QUALCOMM Incorporated, San Diego, CA (US)

(72) Inventors: James Hudson, National City, CA (US); Behnam Dashtipour, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 73 days.

(21) Appl. No.: 16/103,670

(22) Filed: Aug. 14, 2018

(65) Prior Publication Data

US 2019/0056879 A1 Feb. 21, 2019

Related U.S. Application Data

(60) Provisional application No. 62/546,874, filed on Aug. 17, 2017.

(51) Int. Cl.
| | |
|---|---|
| *G06F 3/06* | (2006.01) |
| *G11C 7/20* | (2006.01) |
| *G06F 12/02* | (2006.01) |
| *G11C 5/14* | (2006.01) |

(52) U.S. Cl.
CPC .......... *G06F 3/0632* (2013.01); *G06F 3/0608* (2013.01); *G06F 3/0673* (2013.01); *G06F 12/02* (2013.01); *G11C 5/148* (2013.01); *G11C 7/20* (2013.01)

(58) Field of Classification Search
None
See application file for complete search history.

(56) References Cited

U.S. PATENT DOCUMENTS

| | | | |
|---|---|---|---|
| 7,180,776 B1* | 2/2007 | Wennekamp | G11C 7/24 326/38 |
| 8,566,429 B2* | 10/2013 | Chung | G06F 8/65 709/201 |
| 9,519,795 B2 | 12/2016 | Guarrieri et al. | |
| 2010/0042778 A1* | 2/2010 | Tanguay | G06F 13/1694 711/105 |
| 2012/0008768 A1 | 1/2012 | Mundra et al. | |
| 2013/0304981 A1* | 11/2013 | Paz | G11C 7/1072 711/105 |

(Continued)

OTHER PUBLICATIONS

International Search Report and Written Opinion—PCT/US2018/046878—ISA/EPO—dated Nov. 13, 2018.

*Primary Examiner* — Tracy C. Chan
(74) *Attorney, Agent, or Firm* — Muncy, Geissler, Olds & Lowe, P.C.

(57) ABSTRACT

In some examples of the disclosure, a parameter override mechanism may include a variable length configuration data table with entries for specific models of memory devices. The configuration data table entries may include override parameters for different memory devices and may be dynamically updated with new entries and modifications of existing entries. The parameter override mechanism may be configured to automatically detect a model of memory device and select a corresponding configuration data table entry based on the detected model of memory device or restrict the use of a configuration data table entry based on the detected model of memory device.

27 Claims, 7 Drawing Sheets

(56) References Cited

U.S. PATENT DOCUMENTS

2014/0192583 A1\* 7/2014 Rajan ........................ G11C 7/10
                                                                              365/63
2017/0062039 A1\* 3/2017 Ong ..................... G11C 11/4074
2018/0107417 A1\* 4/2018 Shechter ............... G06F 3/0625

\* cited by examiner

PARAMETER OVERRIDE MECHANISM FOR MEMORY SYSTEMS

CROSS-REFERENCE TO RELATED APPLICATIONS

The present Application for Patent claims the benefit of U.S. Provisional Application No. 62/546,874, entitled "PARAMETER OVERRIDE MECHANISM FOR MEMORY SYSTEMS", filed Aug. 17, 2017, assigned to the assignee hereof, and expressly incorporated herein by reference in its entirety.

FIELD OF DISCLOSURE

This disclosure relates generally to memory systems and more specifically, but not exclusively, to memory subsystems.

BACKGROUND

In conventional memory subsystems, such as low power double data rate synchronous dynamic random-access memory (LPDDR SDRAM), device programming tools are used to load memory subsystem firmware into non-volatile memory of a host device such as a mobile phone. LPDDR (also known as Mobile DDR or as mDDR) is a type of double data rate SDRAM for mobile smart phones and Tablet PC application. The LPDDR is a slightly modified form of DDR SDRAM, with several changes to reduce overall power consumption. Most significantly, the supply voltage is reduced from 2.5 to 1.8V. Additional savings come from temperature-compensated refresh (DRAM requires refresh less often at low temperatures), partial array self-refresh, and a deep power down mode which sacrifices all memory content. Additionally, chips are smaller, using less board space than their non-mobile equivalents. As with all DDR memory, the double data rate is achieved by transferring data on both clock edges of the device.

Since LPDDR SDRAM devices are governed by standards (e.g., JESD209-4, incorporated herein by reference) that detail operation of the devices, the operating parameters for these devices are generally the same. Thus, a host device manufacturer may provide firmware code to configure these standard parameters in both the host device and LPDDR SDRAM to allow the host device to control and interact with the LPDDR SDRAM. However, some LPDDR SDRAM devices that comply with the LPDDR SDRAM standards do not work properly when the standard parameters are used. When these problematic LPDDR SDRAM devices are utilized, the host device manufacturer must provide unique firmware code in an update to allow the host device to interact properly with these problematic LPDDR SDRAM devices. Updating the firmware requires the host device manufacturer to incur additional costs to produce and deliver these updates and uses additional amounts of the limited code space available in the host device to load these updated parameters from non-volatile memory.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a method comprises: activating a host device; reading a boot code from a first memory connected to the host device to a second memory in the host device; reading a configuration data table from the first memory to the second memory; initializing a low power double data rate memory connected to the host device; reading mode registers of the low power double data rate memory to obtain information that differentiates the low power double data rate memory from other memory devices compliant with a same memory standard; determining if a first entry in the configuration data table contains override parameters based on the information; and when the first entry in the configuration data table contains override parameters, configuring the low power double data rate memory based on the override parameters in the first entry of the configuration data table.

In another aspect, a non-transitory computer-readable medium comprising instructions that when executed by a processor cause the processor to perform a method that comprises: activating a host device; reading a boot code from a first memory connected to the host device to a second memory in the host device; reading a configuration data table from the first memory to the second memory; initializing a low power double data rate memory connected to the host device; reading mode registers of the low power double data rate memory to obtain information that differentiates the low power double data rate memory from other memory devices compliant with a same memory standard; determining if a first entry in the configuration data table contains override parameters based on the information; and when the first entry in the configuration data table contains override parameters, configuring the low power double data rate memory based on the override parameters in the first entry of the configuration data table.

In still another aspect, an apparatus comprises: means for reading a boot code from a first memory connected to a host device to a second memory in the host device; means for reading a configuration data table from the first memory to the second memory; means for initializing a low power double data rate memory connected to the host device; means for reading mode registers of the low power double data rate memory to obtain information that differentiates the low power double data rate memory from other memory devices compliant with a same memory standard; means for determining if a first entry in the configuration data table contains override parameters based on the information; and when the first entry in the configuration data table contains override parameters, means for configuring the low power double data rate memory based on the override parameters in the first entry of the configuration data table.

In still another aspect, a method comprises: activating a host device; reading a boot code from a first memory connected to the host device to a second memory in the host device; reading a configuration data table from the first memory to the second memory; initializing a pluggable device connected to the host device; reading device descriptors of the pluggable device to obtain information that differentiates the pluggable device from other pluggable devices compliant with a same standard; determining if a first entry in the configuration data table contains override parameters based on the information; and when the first entry in the configuration data table contains override parameters, configuring the pluggable device based on the override parameters in the first entry of the configuration data table.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
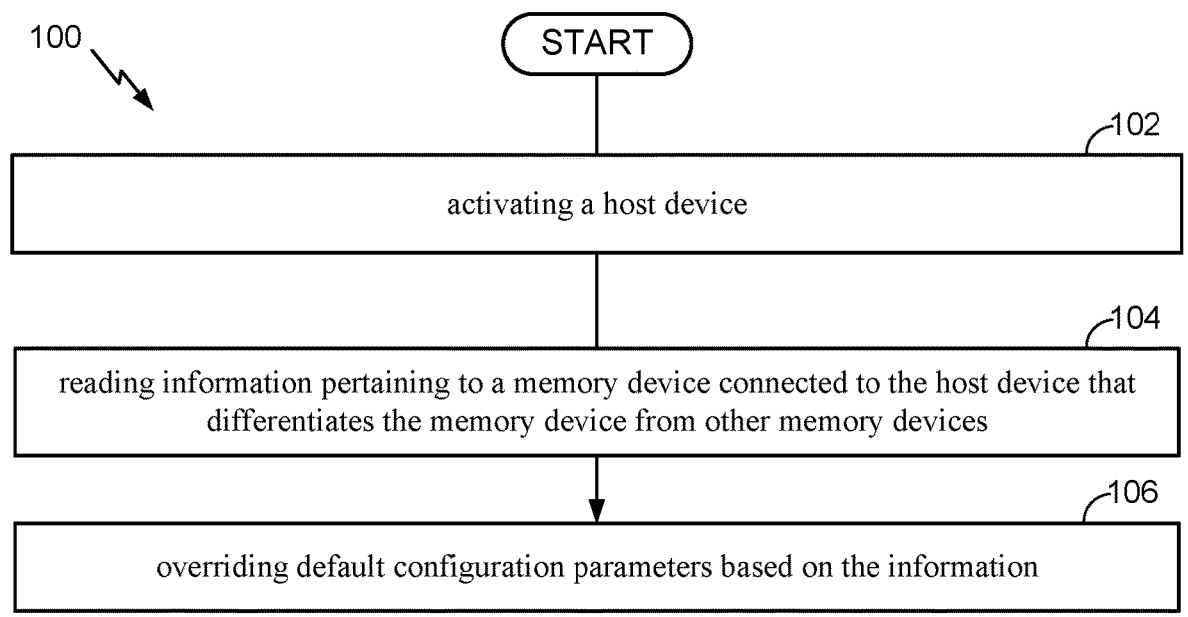
FIG. 1 is an exemplary partial process of configuring a memory subsystem in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Some examples of the disclosure may include an override mechanism and a configuration data table (CDT) to override default or standard DDR subsystem parameters configured by DDR subsystem firmware (DSF). The override mechanism may provide the ability to selectively apply override parameters based on the DDR memory device detected by the override mechanism. The override mechanism may provide the ability for a host device to be configured properly for multiple DDR memory devices in the same host device. In some examples, the CDT may be stored in a non-volatile memory of the host device that may be processed each time the DSF boot code is executed. In addition, to quickly process the CDT, the CDT may be copied to internal host device memory along with the DSF, which may result in the CDT size being limited.

Below is a glossary of terms that may be used in the following description:

CDT: Configuration Data Table—a mechanism for overriding default DDR subsystem parameters;
DSF: DDR Subsystem Firmware—boot and run-time code for configuring the DDR subsystem;
DCB: DDR Config Block—binary code containing default settings for DDR subsystem and CDTs';
DDRSS: DDR subsystem—collection of hardware responsible for controlling the DDR interface;
Memory Device or DRAM: LPDDR4 SDRAM—SDRAM (Synchronous dynamic random access memory) following the LPDDR4 standard;
LPDDR4 Standard: JESD209-4—JEDEC standard document for Low Power Double Data Rate 4 (LPDDR4);
MR: Mode Register—register on DRAM for reading memory device information and configuring memory device parameters; and
TMRS: Test Mode Register Sequence—TMRS provides the ability to supply memory device specific sequences of mode register writes to program memory vendor specific settings not defined by the JEDEC standard.

In some examples of the disclosure, the CDT may comprise 16-bit entries. There may be four types of entries: control, target, override, and TMRS. The entries may be processed as a terminated list. Thus, the CDT may contain a Terminator Entry after all Target and Override entries. Target and Override entries ordered in a specific manner permit applying overrides selectively for specific memory devices and frequencies. An exemplary CDT is shown in Table 1 below:

TABLE 1

Override Drive Strength for 12 Gb Density DRAMs at High Frequencies

| Entry | Bit 15 14 13 | 12 | 11 10 9 | 8 | 7 | 6 | 5 | 4 | 3 | 2 | 1 | 0 |
|---|---|---|---|---|---|---|---|---|---|---|---|---|
| 0 | Target Entry: Density (12 Gb) | | | | | | | | | | | |
|   | 01b | 00b | 0011b | | 00b | | 0011b | | | | 00b | |
| 1 | Target Entry: High Frequency Mask (Four frequencies) | | | | | | | | | | | |
|   | 01b | 01b | 11b | 0b | 00b | | 0001111b | | | | | |
| 2 | Override Entry (MSM ™ DQS pull-up drive strength) | | | | | | | | | | | |
|   | 10b | | 00 1100b | | | | 0000 0100b | | | | | |
| 3 | Terminate Entry: Quit (Quit or Clear All Restrictions) | | | | | | | | | | | |
|   | 00b | 01b | 1b | 0 0000b | | | | 11 1111b | | | | |

TABLE 1-continued

Override Drive Strength for 12 Gb Density DRAMs at High Frequencies

| Entry | Bit 15 14 | 13 12 | 11 10 9 8 7 6 5 4 3 2 1 0 |
|---|---|---|---|
| 4 | 00b | 00b | Terminate Entry: Term (Terminate CDT) 0000 0000 0000b |

Exemplary table entries for the CDT are shown in Table 2 below:

TABLE 2

Defined Entries

| Entry | 15 14 | 13 12 | 11 10 9 | 8 7 6 5 4 3 2 1 0 |
|---|---|---|---|---|
| Term | 00b | 00b | | Reserved |
| Quit | 00b | 01b | Quit | Target Restrictions Clear Mask |
| Reserved | 00b | 10b | | Reserved |
| Reserved | 00b | 11b | | Reserved |
| Manufacturer ID | 01b | 00b | 0000b | Manufacturer ID |
| Revision ID-1 | 01b | 00b | 0001b | Revision ID-1 |
| Revision ID-2 | 01b | 00b | 0010b | Revision ID-2 |
| Density | 01b | 00b | 0011b | Reserved Density Reserved |
| IO Width | 01b | 00b | 0100b | IO Width Reserved |
| Revision ID-1 Rank 1 | 01b | 00b | 0101b | Revision ID-1 |
| Revision ID-2 Rank 1 | 01b | 00b | 0110b | Revision ID-2 |
| Density Rank 1 | 01b | 00b | 0111b | Reserved Density Reserved |
| IO Width Rank 1 | 01b | 00b | 1000b | IO Width Reserved |
| Low Frequency Mask | 01b | 01b | 00b Reserved | Low Frequency Mask |
| High Frequency Mask | 01b | 01b | 11b Clear Reserved | High Frequency Mask |
| Reserved | 01b | 10b | | Reserved |
| Reserved | 01b | 11b | | Reserved |
| MSM™ Override | 10b | 0b | Parameter | Value |
| DRAM Override | 10b | 1b | Parameter | Value |
| TMRS | 11b | | Address (MA[5:0]) | Value (OP[7:0]) |

Terminate entries determine when the processing of the CDT ends and provide a mechanism for removing target restrictions. Exemplary terminate entries are shown in Tables 3-5 below:

TABLE 3

Term Entry

| Bit | 15 14 | 13 12 | 11 10 9 8 7 6 5 4 3 2 1 0 |
|---|---|---|---|
| Value | 00b | 00b | Reserved |

A Term entry must be present at the end of the CDT.

TABLE 4

Quit Entry

| Bit | 15 14 | 13 12 | 11 | 10 9 8 7 6 5 4 3 2 1 0 |
|---|---|---|---|---|
| Value | 00b | 01b | Quit | Target Restrictions Clear Mask |

The Target Restrictions Clear Mask field permits removing target restrictions for the following Override entries. If the Quit bit is set and the memory device matches the current target restrictions, then CDT processing will terminate without examining any more entries.

TABLE 5

Target Restrictions Clear Mask Definition

| Bit | Description |
|---|---|
| 0 | 1b: Clears Manufacturer ID target restriction |
| 1 | 1b: Clears Revision ID-1 target restriction |
| 2 | 1b: Clears Revision ID-2 target restriction |
| 3 | 1b: Clears Density target restriction |
| 4 | 1b: Clears Low Frequency Mask target restriction |
| 5 | 1b: Clears High Frequency Mask target restriction |

TABLE 5-continued

Target Restrictions Clear Mask Definition

| Bit | Description |
|---|---|
| 6 | 1b: Clears IO Width target restriction |
| 7 | 1b: Clears Revision ID-1 Rank 1 target restriction |
| 8 | 1b: Clears Revision ID-2 Rank 1 target restriction |
| 9 | 1b: Clears Density Rank 1 target restriction |
| 10 | 1b: Clears IO Width Rank 1 target restriction |

Target entries restrict the following Override entries to being applied to specific memory devices and frequencies. When no restrictions are in effect, overrides are applied to all manufacturers, all revisions, all densities, and all frequencies. Exemplary target entries are shown in Tables 6-19 below:

TABLE 6

Target Entry

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 01b | | Subtype | | | | | [Subtype Specific] | | | | | | | | |

There are two defined subtypes of Target entries: Mode Register and Frequency.

TABLE 7

Target Entry: Mode Register Subtype

| | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 01b | | 00b | | Mode Register Field | | | | [Mode Register Subtype Specific] | | | | | | | |

There are nine defined Mode Register subtypes: Manufacturer ID, Revision ID-1, Revision ID-2, Density, IO Width, Revision ID-1 Rank 1, Revision ID-2 Rank 1, Density Rank 1, and 10 Width Rank 1.

TABLE 8

Target Entry: Mode Register - Manufacturer ID

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 01b | | 00b | | 0000b | | | | Manufacturer ID | | | | | | | |

The Manufacturer ID field permits restricting overrides to DRAMs with the specified LPDDR4 Manufacturer ID (MR5 OP[7:0]).

TABLE 9

Target Entry: Mode Register - Revision ID-1

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 01b | | 00b | | 0001b | | | | Revision ID-1 | | | | | | | |

The Revision ID-1 field permits restricting overrides to DRAMs with the specified Revision ID-1 on rank 0 (MR6 OP[7:0]).

TABLE 10

| | Target Entry: Mode Register - Revision ID-2 | | | | |
|---|---|---|---|---|---|
| Bit | 15 14 | 13 12 | 11 10 9 8 | 7 6 5 4 3 2 1 0 | |
| Value | 01b | 00b | 0010b | Revision ID-2 | |

The Revision ID-2 field permits restricting overrides to DRAMs with the specified Revision ID-2 on rank 0 (MR7 OP[7:0]).

TABLE 11

| | Target Entry: Mode Register - Density | | | | | |
|---|---|---|---|---|---|---|
| Bit | 15 14 | 13 12 | 11 10 9 8 | 7 6 | 5 4 3 2 | 1 0 |
| Value | 01b | 00b | 0011b | Reserved | Density | Reserved |

The Density field permits restricting overrides to DRAMs with the specified Density on rank 0 (MR8 OP[5:2]).

TABLE 12

| | Target Entry: Mode Register - IO Width | | | | | |
|---|---|---|---|---|---|---|
| Bit | 15 14 | 13 12 | 11 10 9 8 | 7 6 | 5 4 3 2 1 0 | |
| Value | 01b | 00b | 0100b | IO Width | Reserved | |

The IO Width field permits restricting overrides to DRAMs with the specified IO Width on rank 0 (MR8 OP[7:6]).

TABLE 13

| | Target Entry: Mode Register - Revision ID-1 Rank 1 | | | | |
|---|---|---|---|---|---|
| Bit | 15 14 | 13 12 | 11 10 9 8 | 7 6 5 4 3 2 1 0 | |
| Value | 01b | 00b | 0101b | Revision ID-1 | |

The Revision ID-1 field permits restricting overrides to DRAMs with the specified Revision ID-1 on rank 1 (MR6 OP[7:0]).

TABLE 14

| | Target Entry: Mode Register - Revision ID-2 Rank 1 | | | | |
|---|---|---|---|---|---|
| Bit | 15 14 | 13 12 | 11 10 9 8 | 7 6 5 4 3 2 1 0 | |
| Value | 01b | 00b | 0110b | Revision ID-2 | |

The Revision ID-2 field permits restricting overrides to DRAMs with the specified Revision ID-2 on rank 1 (MR7 OP[7:0]).

TABLE 15

| | Target Entry: Mode Register - Density Rank 1 | | | | | |
|---|---|---|---|---|---|---|
| Bit | 15 14 | 13 12 | 11 10 9 8 | 7 6 | 5 4 3 2 | 1 0 |
| Value | 01b | 00b | 0111b | Reserved | Density | Reserved |

The Density field permits restricting overrides to DRAMs with the specified Density on rank 1 (MR8 OP[5:2]).

TABLE 16

Target Entry: Mode Register - IO Width Rank 1

| Bit | 15 14 | 13 12 | 11 10 9 8 | 7 6 5 4 | 3 2 1 0 |
|---|---|---|---|---|---|
| Value | 01b | 00b | 1000b | IO Width | Reserved |

The IO Width field permits restricting overrides to DRAMs with the specified IO Width on rank 1 (MR8 OP[7:6]).

TABLE 17

Target Entry: Frequency Mask Subtype

| Bit | 15 14 | 13 12 | 11 10 9 8 | 7 6 5 4 3 2 1 0 |
|---|---|---|---|---|
| Value | 01b | 01b | Mask | [Frequency Mask Subtype Specific] |

There are two defined Frequency Mask subtypes: Low and High. When a Target Entry of the Frequency Mask subtype is provided, overrides will only be applied to the frequencies which are specified.

TABLE 18

Target Entry: Frequency Mask - Low

| Bit | 15 14 | 13 12 | 11 10 | 9 8 | 7 6 5 4 3 2 1 0 |
|---|---|---|---|---|---|
| Value | 01b | 01b | 00b | Reserved | Low Frequency Mask |

The Low Frequency Mask field permits restricting overrides to the specified frequencies. The low frequency mask applies to the first eight frequencies in the DDR clock plan.

TABLE 19

Target Entry: Frequency Mask - High

| Bit | 15 14 | 13 12 | 11 10 | 9 | 8 | 7 6 5 4 3 2 1 0 |
|---|---|---|---|---|---|---|
| Value | 01b | 01b | 11b | Clear | Reserved | High Frequency Mask |

The High Frequency Mask field permits restricting overrides to the specified frequencies. If the Clear bit is set, the Low Frequency Mask restrictions are cleared. The high frequency mask applies to the next seven frequencies in the DDR clock plan.

Override entries specify the parameter which should be overwritten and the value to apply. Exemplary override entries are shown in Tables 20-23 below:

TABLE 20

MSM Override Entry

| Bit | 15 14 | 13 12 | 11 10 9 8 | 7 6 5 4 3 2 1 0 |
|---|---|---|---|---|
| Value | 10b | 0b | Parameter | Value |

TABLE 21

MSM Parameter Definition

| Value | | Description |
|---|---|---|
| 0d | CA | Pull-up drive strength |
| 1d | | Pull-down drive strength |
| 2d | | Output voltage high level (VOH) |
| 3d | | Termination (ODT) |
| 4d | CK | Pull-up drive strength |
| 5d | | Pull-down drive strength |
| 6d | | Output voltage high level (VOH) |
| 7d | | Termination (ODT) |
| 8d | DQ | Pull-up drive strength |
| 9d | | Pull-down drive strength |
| 10d | | Output voltage high level (VOH) |
| 11d | | Termination (ODT) |
| 12d | DQS | Pull-up drive strength |
| 13d | | Pull-down drive strength |
| 14d | | Output voltage high level (VOH) |
| 15d | | Termination (ODT) |

TABLE 22

DRAM Override Entry

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 10b | | 1b | | Parameter | | | | | | | Value | | | | |

TABLE 23

DRAM Parameter Definition

| Value | | Description |
|---|---|---|
| 0d | CA | Termination (ODT), MR11 OP[2:0] -CA ODT |
| 1d | DQ | Termination (ODT), MR11 OP[6:4] - DQ ODT |
| 2d | | Output voltage high level (VOH), MR3 OP[0] - PU-Cal |
| 3d | | Pull-up drive strength, MR22 OP[2:0] - CODT |
| 4d | | Pull-down drive strength, MR3 OP[5:3] - PDDS |

TMRS entries provide a means of writing a sequence of mode registers provided by the memory device vendor to resolve an issue. An exemplary TMRS entry is shown in Table 24 below:

TABLE 24

TMRS Entry

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 11b | | Address (MA[5:0]) | | | | | | Value (OP[7:0]) | | | | | | | |

Figure 6:
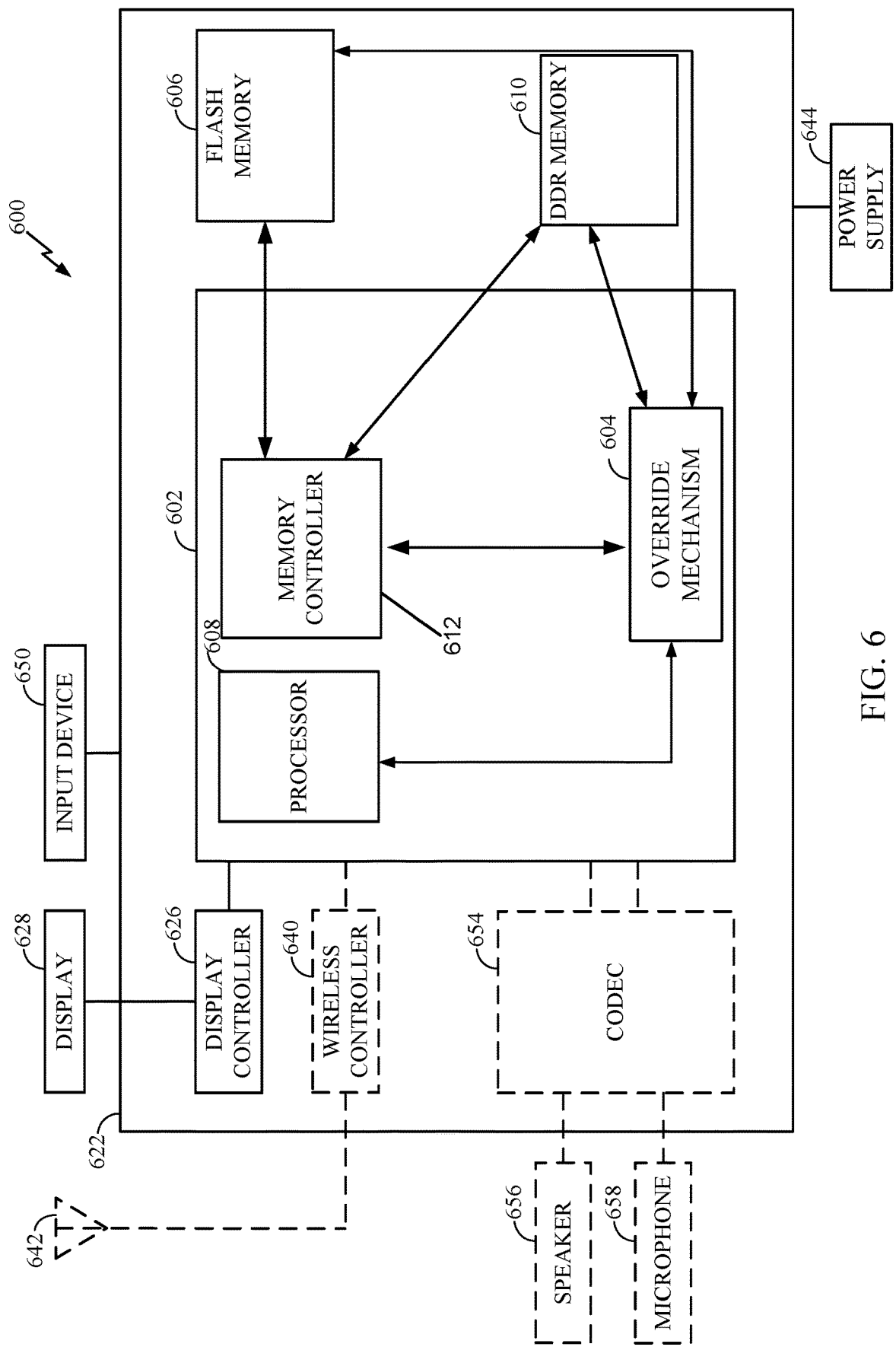
FIG. 6 illustrates an exemplary computing device, in which an aspect of the disclosure may be advantageously employed in accordance with some examples of the disclosure.

The use of the CDT described above will now be explained with reference to the power on boot cycle of a host device. In some examples of the disclosure, a host device may include a processor (e.g., processor 608), a flash memory (e.g., flash memory 606), a DDR memory (e.g., DDR memory 610), a memory controller 612, and an override mechanism (e.g., override mechanism 604). When the host device is activated (e.g., power on), a boot sequence is run to initialize the host device. One part of the boot sequence may be executing the DSF boot code to initialize the DDR memory (e.g., DDR memory 610). These DSF boot codes, for example, may contain timing parameters, drive strengths, termination values, reference voltage levels, and output voltage levels. The host device utilizing the DDR memory may determine key parameters of the DDR memory by reading information from an attached source. For example, the SPD data on a SDRAM module might provide information about the Column Access Strobe (CAS) latency so the system can set this correctly without user intervention. For another example, the mode registers of an LPDDR memory device provide information about the device density and IO width so the system can set addressing parameters correctly without user intervention. The DSF boot code may be stored in an installed flash memory. The DSF boot code may enable the memory controller to be properly configured to access the installed LPDDR memory. In one example, the boot sequence may involve reading the DSF boot code from the installed flash memory and storing that boot code in system memory such as the cache of a processor. While the memory controller 612 shown in FIG. 6 is illustrated as connected to both the flash memory 606 and the DDR memory 610, is should be understood that the flash memory 606 may be connected through a separate controller (not shown). During the boot sequence, the host device may retrieve the DSF boot code from the installed flash memory and store the DSF in the system memory for quicker access and execution. However, the DSF boot code may be accessed and executed without storing the DSF boot code in the system memory.

At the time of power on, the processor is uninitialized and a basic clock setup, system specifics' setup is required before proceeding to bigger and more complex tasks. A piece of code is required at power on that does the basic system setup before handing over the control to a bootloader present in flash (already programmed) or to support a download tool for programming the flash and then handing over the control to the bootloader present in flash. For this purpose, a hardware bootloader generally called a Boot Rom is provided by the host device vendor (pre-loaded into the processors' internal ROM). This is hardwired at the manufacturing time. After a power on reset that causes the processor core to jump to the reset vector, Boot Rom is the first code to execute in the processor. The Boot rom performs the essential initialization including programming the clocks, stacks, interrupt set up, etc. The Boot rom will detect the boot media using a system register. This is to determine where to find the software bootloader. A particular sequence of probing for boot media is followed as defined by the manufacturer. This includes the order of looking for bootloader in external NOR/NAND flash, or probing for some specific characters on UART/USB for establishing connection with downloader to download the binary in flash. If no bootloader is found in any external memory, boot rom listens for a download request on UART/USB port to start the download process. Thus during the probing process, if the flash has already been programmed, a software (SW) bootloader will be detected to be available in flash, if not it will be downloaded to the flash by the boot rom. This probing sequence may generally assign higher priority to external memory, so if bootloader is detected to be present in memory, the processor will proceed to downloading the image again. For platforms using NAND flash, for example, the boot rom will load this boot loader to internal RAM and set the program counter at the load address of the SW bootloader in RAM. The main task of SW bootloader is to load the operating system and pass over the execution to the operating system after setting up the necessary environment. To set up the necessary environment, the bootloader must first initialize the DDR memory (this includes setting up the controller, refresh rate, etc.). This may be done by reading the DSF boot code from ROM in the flash memory and executing the DSF boot code (with or without storing the DSF boot code in the system memory). By executing the DSF boot code, the memory controller may be configured to access the DDR memory by configuring memory access parameters in the memory controller using the parameters in the DSF boot code. These parameters may be based on the JEDEC standards for specific types of memory (e.g., DDR1, DDR2, DDR3, DDR4, LPDDR1, LPDDR2, LPDDR3, and LPDDR4). However, these standard parameters might not result in trouble free access of the DDR memory. By using a CDT, the host device may be able to overcome any problems encountered with the standard based parameters.

Once the memory controller is configured with the initial parameters of the DSF boot code stored in the flash memory module, an override mechanism (e.g., override mechanism 604) may instruct the processor and memory controller to engage in second boot process to override these initial parameters. Alternatively, the override mechanism may preempt the initial configuration using the DSF boot code parameters and immediately start with the override parameters stored in the CDT, which will speed up the power on boot cycle. The override mechanism first obtains manufacturer model information used to differentiate the installed DDR memory from other memory that could be installed. The detection may include the memory type, manufacturer, revision, the number of memories, size, etc. Once the type of DDR memory is determined, the override mechanism may compare the detected memory to the CDT table to see if there is a match. If no match is found, the initial parameters from the DSF boot code may be used whether already configured in the memory controller or, if the override boot process occurs first, allowing the DSF boot code to run normally. If a match is found, the override mechanism may configure the memory controller using the parameters in the CDT entry corresponding to the detected memory. As described above, the CDT may be a variable length that allows dynamic updates to the CDT and partitioned and digitally signed separately from the firmware provided by the host device manufacturer to avoid costly firmware updates as opposed to a fixed length table or table partitioned with the firmware signed by the host device manufacturer. The CDT table may also include different types of entries such as control, target, override, and TMRS. Therefore, even when a detected memory matches a specific entry, a specific manufacturer for example, the CDT may include further target restriction entries, a revision for example, that prevent the override mechanism from using the parameters for specific memories. In addition, the CDT may include a default entry that is used for all memories unless a target restriction for a specific memory is found, which may allow the CDT to configure the memory controller with default parameters regardless of the parameters included in boot code except when the detected memory matches a target restriction entry. This may allow the CDT more control over the memory controller and DDR memory configuration without having to rely on the parameters stored by the host device manufacturer unless desired.

FIG. 1 is an exemplary partial process of configuring a memory subsystem in accordance with some examples of the disclosure. As shown in FIG. 1, the partial process 100 begins in block 102 with activating a host device. The partial process 100 continues in block 104 with reading information pertaining to a memory device connected to the host device that differentiates the memory device from other memory devices. The partial process 100 concludes in block 106 with overriding default configuration parameters based on the information.

Figure 2:
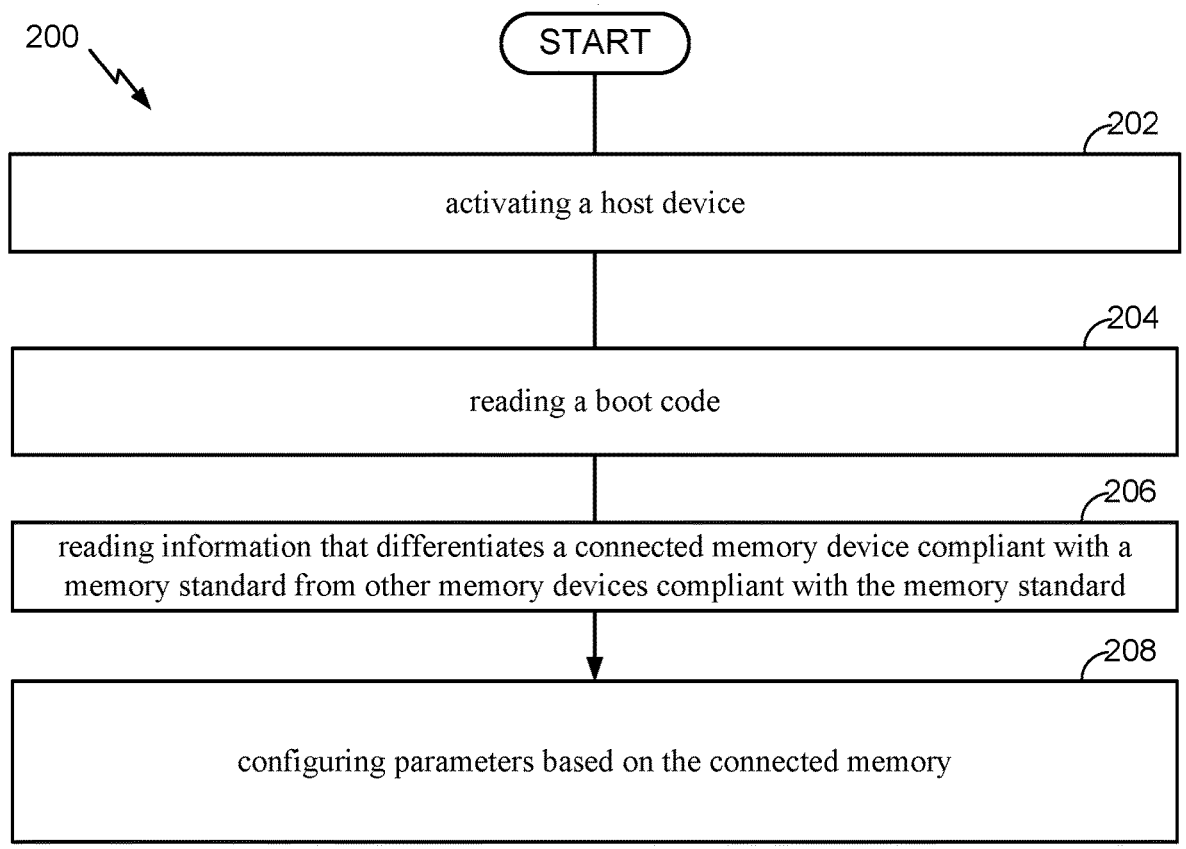
FIG. 2 is an exemplary partial process of configuring a memory subsystem by using memory specific parameters in accordance with some examples of the disclosure.

FIG. 2 is an exemplary partial process of configuring a memory subsystem by using memory specific parameters in accordance with some examples of the disclosure. As shown in FIG. 2, the partial process 200 begins in block 202 with activating a host device. The partial process 200 continues in block 204 with reading a boot code. The partial process 200 continues in block 206 with reading information that differentiates a connected memory device compliant with a memory standard from other memory devices compliant with the memory standard. The partial process 200 concludes in block 208 with configuring parameters based on the connected memory.

Figure 3:
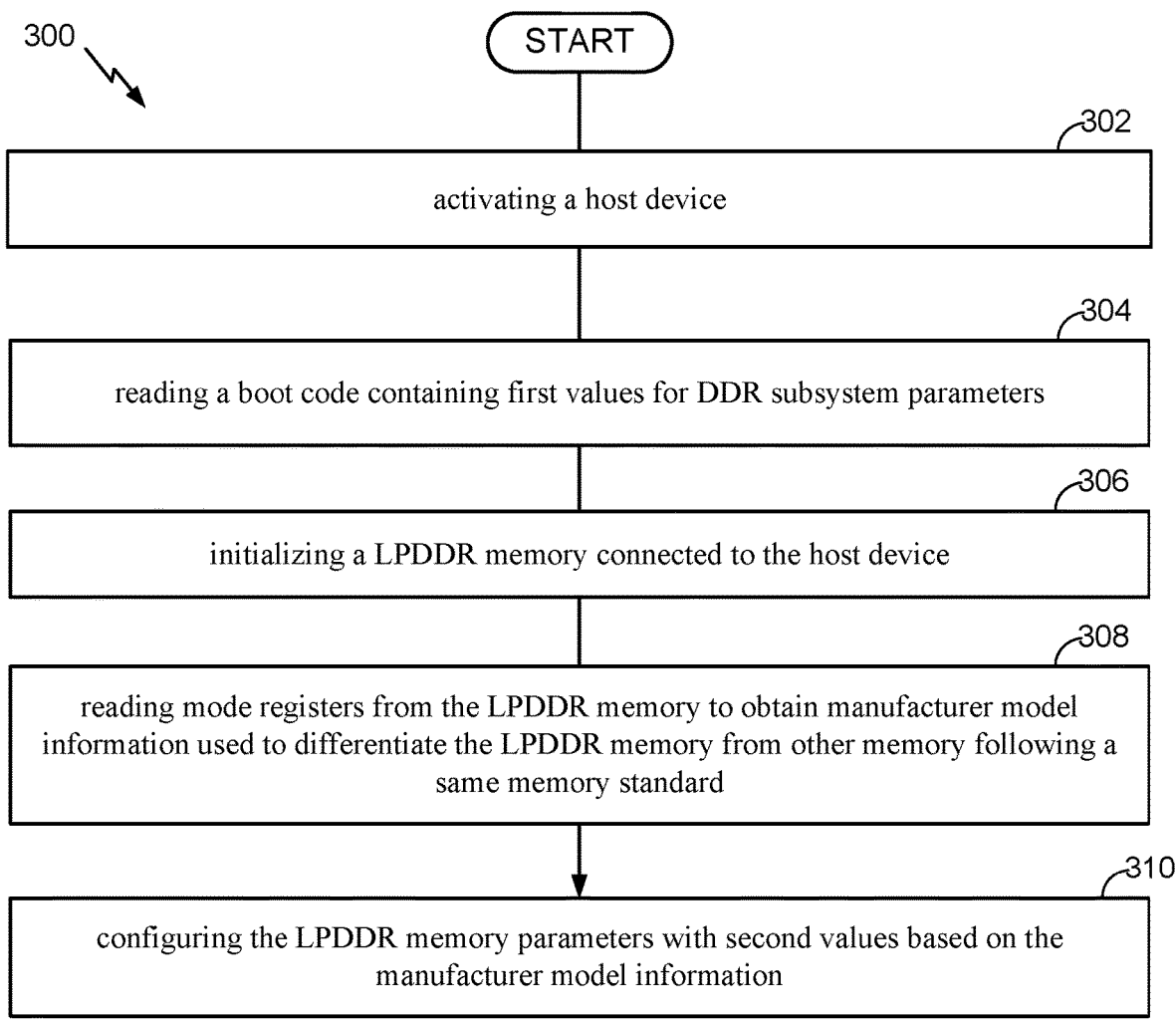
FIG. 3 is an exemplary partial process of configuring a memory subsystem compliant with a memory standard in accordance with some examples of the disclosure.

FIG. 3 is an exemplary partial process of configuring a memory subsystem compliant with a memory standard in accordance with some examples of the disclosure. As shown in FIG. 3, the partial process 300 begins in block 302 with activating a host device. The partial process 300 continues in block 304 with reading a boot code containing first values for DDR subsystem parameters. The partial process 300 continues in block 306 with initializing a LPDDR memory connected to the host device. The partial process 300 continues in block 308 with reading mode registers from the LPDDR memory to obtain manufacturer model information used to differentiate the LPDDR memory from other memory following a same memory standard. The partial process 300 concludes in block 310 with configuring the LPDDR memory parameters with second values based on the manufacturer model information.

Figure 4:
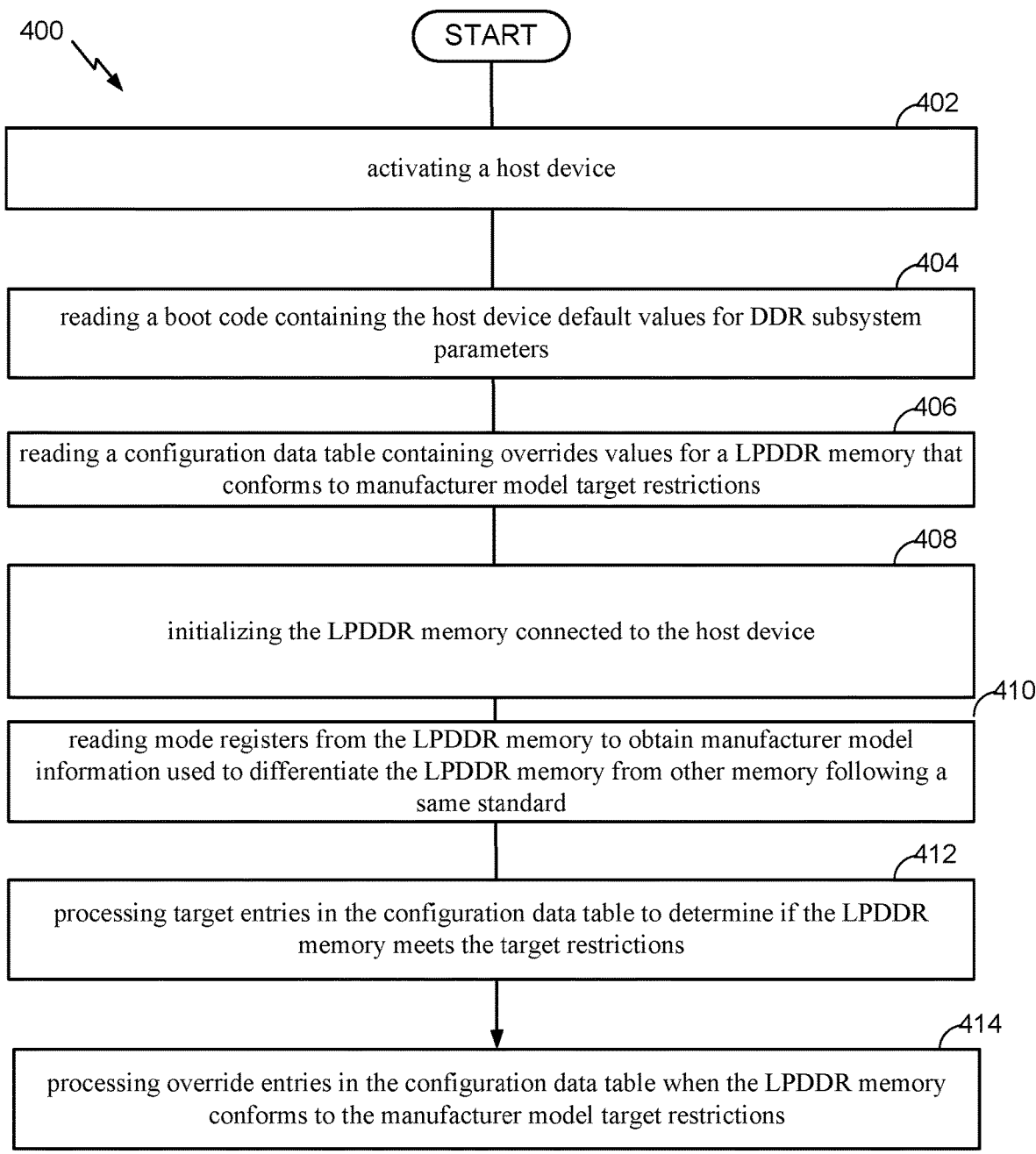
FIG. 4 is an exemplary partial process of configuring a memory subsystem by using override entries in a configuration data table in accordance with some examples of the disclosure.

FIG. 4 is an exemplary partial process of configuring a memory subsystem by using override entries in a configuration data table in accordance with some examples of the disclosure. As shown in FIG. 4, the partial process 400 begins in block 402 with activating a host device. The partial process 400 continues in block 404 with reading a boot code containing the host device default values for DDR subsystem parameters. The partial process 400 continues in block 406 with reading a configuration data table containing overrides values for a LPDDR memory that conforms to manufacturer model target restrictions. The partial process 400 continues in block 408 with initializing the LPDDR memory connected to the host device. The partial process 400 continues in block 410 with reading mode registers from the LPDDR memory to obtain manufacturer model information used to differentiate the LPDDR memory from other memory following a same standard. The partial process 400 continues in block 412 with processing target entries in the configuration data table to determine if the LPDDR memory meets the target restrictions. The partial process 400 concludes in block 414 with processing override entries in the configuration data table when the LPDDR memory conforms to the manufacturer model target restrictions.

Figure 5:
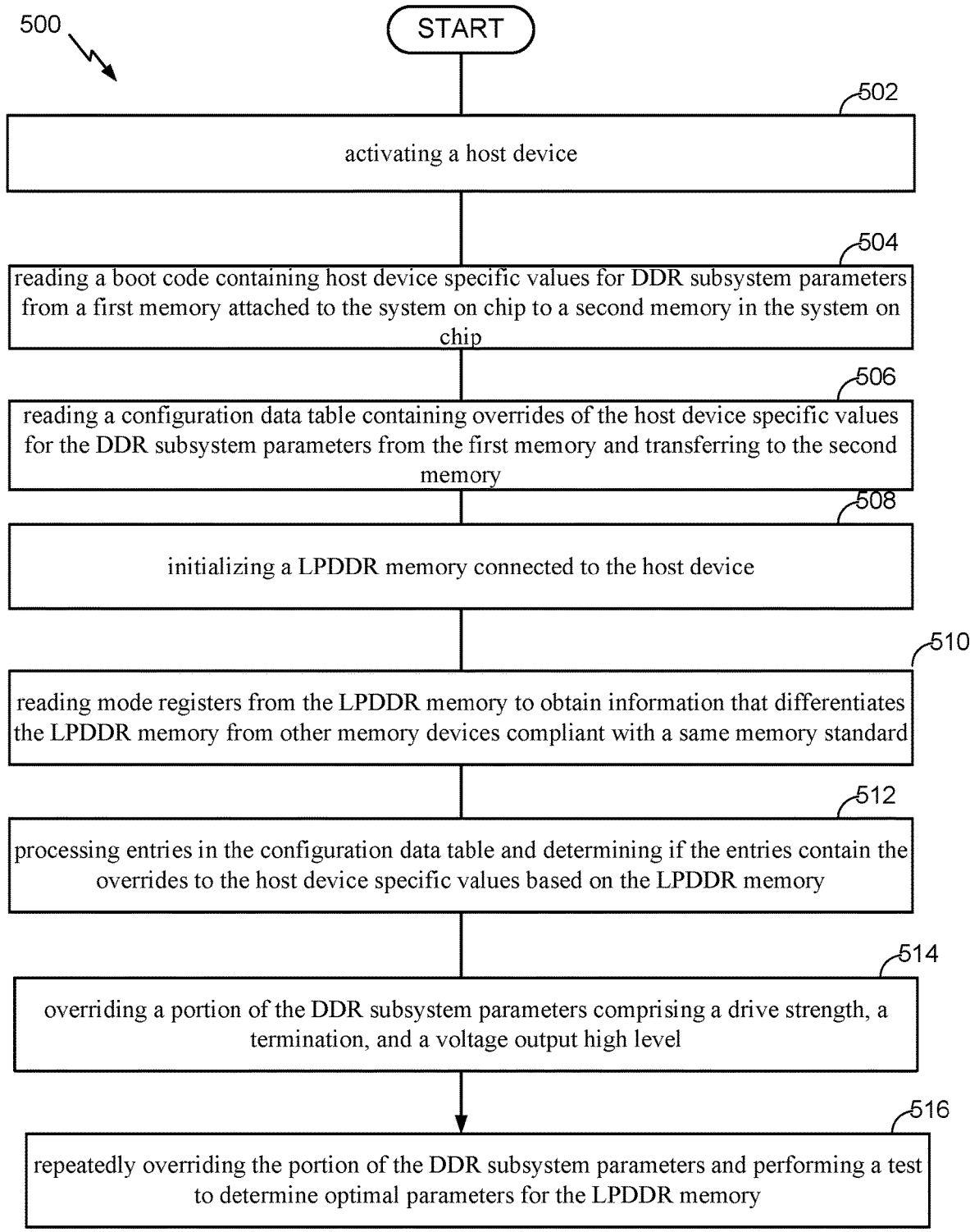
FIG. 5 is an exemplary partial process of configuring a memory subsystem with optimal parameters in accordance with some examples of the disclosure.

FIG. 5 is an exemplary partial process of configuring a memory subsystem with optimal parameters in accordance with some examples of the disclosure. As shown in FIG. 5, the partial process 500 begins in block 502 with activating a host device. The partial process 500 continues in block 504 with reading a boot code containing host device specific values for DDR subsystem parameters from a first memory attached to the system on chip to a second memory in the system on chip. The partial process 500 continues in block 506 with reading a configuration data table containing overrides of the host device specific values for the DDR subsystem parameters from the first memory and transferring to the second memory. The partial process 500 continues in block 508 with initializing a LPDDR memory connected to the host device. The partial process 500 continues in block 510 with reading mode registers from the LPDDR memory to obtain information that differentiates the LPDDR memory from other memory devices compliant with a same memory standard. The partial process 500 continues in block 512 with processing entries in the configuration data table and determining if the entries contain the overrides to the host device specific values based on the LPDDR memory. The partial process 500 continues in block 514 with overriding a portion of the DDR subsystem parameters comprising a drive strength, a termination, and a voltage output high level. The partial process 500 concludes in block 516 with repeatedly overriding the portion of the DDR subsystem parameters and performing a test to determine optimal parameters for the LPDDR memory. A test may include writing data to the LPDDR memory and reading the data back to confirm it is written and read correctly. A test may additionally include modifying other parameters such as strobe delay for received data to determine the amount of setup and hold timing margins. A test may additionally include modifying reference voltage for received data to measure voltage margin up and down from the default reference point. Based on these timing and voltage margins, the most optimal override setting may be selected.

FIG. 6 illustrates an exemplary computing device, in which an aspect of the disclosure may be advantageously employed in accordance with some examples of the disclosure. Referring now to FIG. 6, a block diagram of a computing device that is configured according to exemplary aspects is depicted and generally designated 600. In some aspects, computing device 600 (e.g., host device of FIGS. 1-5) may be configured as a wireless communication device or a server. As shown, computing device 600 includes processor-based system 602, which may be configured to implement processes 100-500 of FIGS. 1-5 in some aspects. Processor-based system 602 is shown in FIG. 6 with override mechanism 604, flash memory 606, processor 608, DDR memory 610, and memory controller 612 while other details of the processor-based system 602 have been omitted from this view for the sake of clarity. The processor-based system 602 may be coupled to the override mechanism 604, flash memory 606, processor 608, DDR memory 610, and/or memory controller 612 using a link, which may be a die-to-die or chip-to-chip link.

Processor-based system 602 may be communicatively coupled to flash memory 606 and DDR memory 610 through memory controller 612 over a link, such as a die-to-die or chip-to-chip link. Computing device 600 may also include a display 628 and a display controller 626 coupled to processor-based system 602 and to display 628. It should be understood that the display 628 and the display controller 626 are optional.

In some aspects, FIG. 6 may include some optional blocks shown with dashed lines. For example, computing device 600 may optionally include coder/decoder (CODEC) 654 (e.g., an audio and/or voice CODEC) coupled to processor-based system 602; speaker 656 and microphone 658 coupled to CODEC 654; and wireless controller 640 (which may include a modem) coupled to wireless antenna 642 and to processor-based system 602.

In a particular aspect, where one or more of the above-mentioned optional blocks are present, processor-based system 602, display controller 626, CODEC 654, and wireless controller 640 can be included in a system-in-package or system-on-chip device 622. Input device 650, power supply 644, display 628, input device 650, speaker 656, microphone 658, wireless antenna 642, and power supply 644 may be external to system-on-chip device 622 and may be coupled to a component of system-on-chip device 622, such as an interface or a controller.

It should be noted that although FIG. 6 depicts a computing device 600, processor-based system 602, flash memory 606, DDR memory 610, memory controller 612 may also be integrated into a set top box, a music player, a video player, an entertainment unit, a navigation device, a personal digital assistant (PDA), a fixed location data unit, a server, a computer, a laptop, a tablet, a communications device, a mobile phone, server, or other similar devices. While a single memory controller 612 is shown connected to both the flash memory 606 and DDR memory 610, it should be understood that more than one memory controller may be used and each memory may have a separate memory controller and/or interface that communicatively couples the memory to the processor-based system 602.

Figure 7:
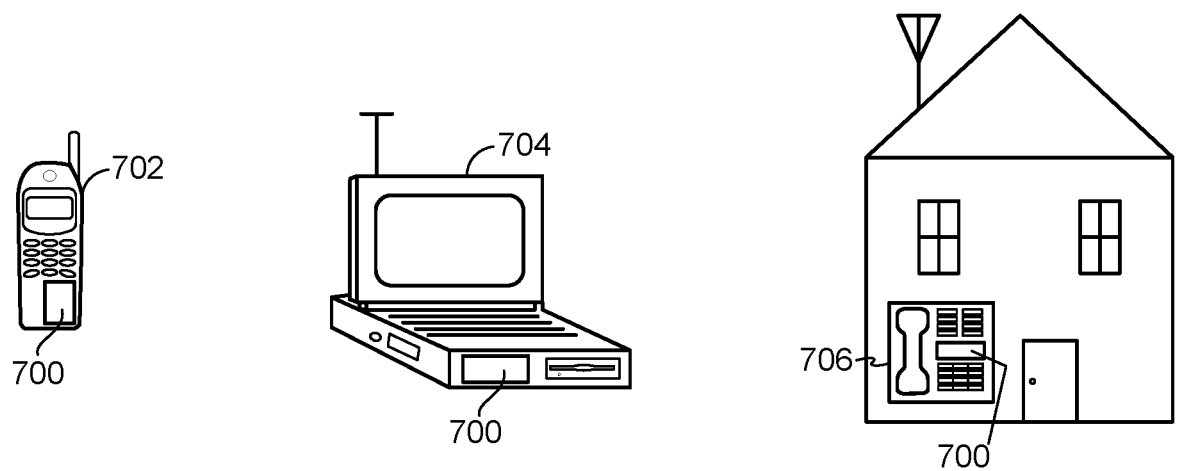
FIG. 7 illustrates various electronic devices that may be integrated with any of the aforementioned processes, methods, components, or mechanisms in accordance with some examples of the disclosure.

FIG. 7 illustrates various electronic devices that may be integrated with any of the aforementioned processes, methods, components, or mechanisms in accordance with some examples of the disclosure. For example, a mobile phone device 702, a laptop computer device 704, and a fixed location terminal device 706 may include an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. In one example of the disclosure, a host device may include an interface (e.g., a memory slot) for a pluggable device (e.g., a memory chip or module) that may be inserted into the host device and communicatively coupled to the host device through the interface. After the pluggable device is inserted into the host device, such as through a plug and play socket, the host device may use manufacturer supplied parameters to configure the interface or may use generic default parameters to initially configure the interface. Once the initial configuration of the interface is complete (or in place of the initial configuration), the host device may reference custom parameters associated with different plug and play or hot plug devices. This may be done through a table that includes multiple entries with each entry associated with different plug and play models. When a match is found in the table, the host device may configure the interface to use the custom parameters from the table entry. While parts of this disclosure provide examples using memory devices such as LPDDR memory, it should be understood that the examples herein may include other types of pluggable devices as well.

In another example, in one aspect, an apparatus may comprise a means for reading a boot code from a first memory connected to the host device to a second memory in the host device (e.g., flash memory, 606, DDR memory, 610, memory controller 612, processor 608 of FIG. 6); means for reading a configuration data table from the first memory to the second memory (e.g., flash memory, 606, DDR memory, 610, memory controller 612, processor 608 of FIG. 6); means for initializing a low power double data rate memory connected to the host device (e.g., memory controller 612, processor 608 of FIG. 6); means for reading mode registers of the low power double data rate memory to obtain information that differentiates the low power double data rate memory from other memory devices compliant with a same memory standard (e.g., flash memory, 606, DDR memory, 610, memory controller 612, processor 608 of FIG. 6); means for determining if a first entry in the configuration data table contains override parameters based on the information (e.g., flash memory, 606, processor 608 of FIG. 6); and when the first entry in the configuration data table contains override parameters, means for configuring the low power double data rate memory based on the override parameters in the first entry of the configuration data table (e.g., flash memory, 606, DDR memory, 610, memory controller 612, processor 608 of FIG. 6). It will be appreciated that the aforementioned aspects are merely provided as examples and the various aspects claimed are not limited to the specific references and/or illustrations cited as examples.

One or more of the components, processes, features, and/or functions illustrated in FIGS. 1-7 may be rearranged and/or combined into a single component, process, feature or function or incorporated in several components, processes, or functions. Additional elements, components, processes, and/or functions may also be added without departing from the disclosure. It should also be noted that FIGS. 1-7 and its corresponding description in the present disclosure is not limited to dies and/or ICs. In some implementations, FIGS. 1-7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation.

Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "installed," "connected," "coupled," or any variant thereof, mean any connection or coupling, either direct or indirect, between elements, and can encompass a presence of an intermediate element between two elements that are "installed," "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be incorporated entirely within any form of computer-readable storage medium having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A method comprising:
   activating a host device;
   reading a boot code from a first memory connected to the host device to a second memory in the host device;
   reading configuration data from the first memory to the second memory;
   initializing a low power double data rate memory connected to the host device;
   reading mode registers of the low power double data rate memory to obtain information that differentiates the low power double data rate memory from other memory devices compliant with a same memory standard;
   determining if a first entry in the configuration data contains override parameters based on the information; and
   when the first entry in the configuration data contains override parameters, configuring the low power double data rate memory based on the override parameters in the first entry of the configuration data.

2. The method of claim 1, wherein the low power double data rate memory is a low power double data rate synchronous dynamic random-access memory.

3. The method of claim 1, wherein the low power double data rate memory is initialized with default parameters.

4. The method of claim 1, wherein the configuration data is partitioned and digitally signed separately from a firmware.

5. The method of claim 1, wherein optimal parameters are determined through testing multiple override parameter options.

6. The method of claim 1, further comprising determining if a second entry in the configuration data contains override parameters based on the information; and
when the second entry in the configuration data contains override parameters, configuring the low power double data rate memory based on the override parameters in the second entry of the configuration data.

7. The method of claim 1, wherein the host device is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. A non-transitory computer-readable medium comprising instructions that when executed by a processor cause the processor to perform a method comprising:
activating a host device;
reading a boot code from a first memory connected to the host device to a second memory in the host device;
reading configuration data from the first memory to the second memory;
initializing a low power double data rate memory connected to the host device;
reading mode registers of the low power double data rate memory to obtain information that differentiates the low power double data rate memory from other memory devices compliant with a same memory standard;
determining if a first entry in the configuration data contains override parameters based on the information; and
when the first entry in the configuration data contains override parameters, configuring the low power double data rate memory based on the override parameters in the first entry of the configuration data.

9. The non-transitory computer-readable medium of claim 8, wherein the low power double data rate memory is a low power double data rate synchronous dynamic random-access memory.

10. The non-transitory computer-readable medium of claim 8, wherein the low power double data rate memory is initialized with default parameters.

11. The non-transitory computer-readable medium of claim 8, wherein the configuration data is partitioned and digitally signed separately from a firmware.

12. The non-transitory computer-readable medium of claim 8, wherein optimal parameters are determined through testing multiple override parameter options.

13. The non-transitory computer-readable medium of claim 8, further comprising determining if a second entry in the configuration data contains override parameters based on the information; and when the second entry in the configuration data contains override parameters, configuring the low power double data rate memory based on the override parameters in the second entry of the configuration data.

14. The non-transitory computer-readable medium of claim 8, wherein the host device is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

15. An apparatus comprising:
means for reading a boot code from a first memory connected to a host device to a second memory in the host device;
means for reading configuration data from the first memory to the second memory;
means for initializing a low power double data rate memory connected to the host device;
means for reading mode registers of the low power double data rate memory to obtain information that differentiates the low power double data rate memory from other memory devices compliant with a same memory standard;
means for determining if a first entry in the configuration data contains override parameters based on the information; and
when the first entry in the configuration data contains override parameters, means for configuring the low power double data rate memory based on the override parameters in the first entry of the configuration data.

16. The apparatus of claim 15, wherein the configuration data is partitioned and digitally signed separately from a firmware.

17. The apparatus of claim 15, wherein optimal parameters are determined through testing multiple override parameter options.

18. The apparatus of claim 15, wherein the boot code contains host device specific default parameters for initializing the low power double data rate memory.

19. The apparatus of claim 15, further comprising means for determining if a second entry in the configuration data contains override parameters based on the information; and when the second entry in the configuration data contains override parameters, means for configuring the low power double data rate memory based on the override parameters in the second entry of the configuration data.

20. The apparatus of claim 15, wherein the host device is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method comprising:
activating a host device;
reading a boot code from a first memory connected to the host device to a second memory in the host device;
reading configuration data from the first memory to the second memory;
initializing a pluggable device connected to the host device;
reading device descriptors of the pluggable device to obtain information that differentiates the pluggable device from other pluggable devices compliant with a same standard;

determining if a first entry in the configuration data contains override parameters based on the information; and when the first entry in the configuration data contains override parameters, configuring the pluggable device based on the override parameters in the first entry of the configuration data.

22. The method of claim 21, wherein the pluggable device is a low power double data rate synchronous dynamic random-access memory.

23. The method of claim 21, wherein the device descriptors are stored in mode registers of the pluggable device.

24. The method of claim 21, wherein the configuration data is partitioned and digitally signed separately from a firmware.

25. The method of claim 21, wherein optimal parameters are determined through testing multiple override parameter options.

26. The method of claim 21, further comprising determining if a second entry in the configuration data contains override parameters based on the information; and when the second entry in the configuration data contains override parameters, configuring the pluggable device based on the override parameters in the second entry of the configuration data.

27. The method of claim 21, wherein the host device is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *